US011363740B2

(12) United States Patent
Deng

(10) Patent No.: US 11,363,740 B2
(45) Date of Patent: Jun. 14, 2022

(54) MODULARIZED WATER-COOLING HEAT SINK

(71) Applicant: Dongguan Jianxin Electronic Technology Co., Ltd., Dongguan (CN)

(72) Inventor: Jianqiang Deng, Dongguan (CN)

(73) Assignee: Dongguan Jianxin Eleotronic Technology Co., Ltd., Dongguan (CN)

( * ) Notice: Subject to any disclaimer, the term of this patent is extended or adjusted under 35 U.S.C. 154(b) by 0 days.

(21) Appl. No.: 17/249,752

(22) Filed: Mar. 11, 2021

(65) Prior Publication Data

US 2021/0204443 A1 Jul. 1, 2021

Related U.S. Application Data

(63) Continuation-in-part of application No. 16/374,439, filed on Apr. 3, 2019, now abandoned.

(30) Foreign Application Priority Data

Jan. 23, 2019 (CN) .......................... 201910063610.9
Jan. 23, 2019 (CN) .......................... 201920125084.X

(51) Int. Cl.
*H05K 7/20* (2006.01)
*G06F 1/20* (2006.01)

(52) U.S. Cl.
CPC ....... *H05K 7/20272* (2013.01); *H05K 7/2039* (2013.01); *H05K 7/20263* (2013.01); *G06F 1/20* (2013.01); *G06F 2200/201* (2013.01)

(58) Field of Classification Search
CPC .......... H05K 7/20272; H05K 7/20263; H05K 7/2039; F28F 9/262; G06F 1/20; G06F 2200/201
See application file for complete search history.

(56) References Cited

U.S. PATENT DOCUMENTS

| | | | |
|---|---|---|---|
| 9,927,181 B2 * | 3/2018 | Mounioloux | ....... F28D 1/05375 |
| 10,834,850 B2 * | 11/2020 | Deng | ................ F28D 1/05383 |
| 2009/0044929 A1 * | 2/2009 | Yeh | ........................ H01L 23/473 165/104.19 |
| 2017/0115708 A1 * | 4/2017 | Tivadar | ..................... G06F 1/20 |
| 2019/0075681 A1 * | 3/2019 | Xiao | ................... F28D 1/05375 |
| 2019/0090384 A1 * | 3/2019 | Xiao | ..................... F28D 1/0471 |
| 2019/0104641 A1 * | 4/2019 | Fan | .......................... G06F 1/203 |

* cited by examiner

*Primary Examiner* — Jon T. Schermerhorn, Jr.
(74) *Attorney, Agent, or Firm* — Wang Law Firm, Inc.

(57) ABSTRACT

A modularized water-cooling heat sink includes a cold discharge body, a water tank and a water pump. The water pump is connected with the water tank, and connected with the cold discharge body via an external cold head. The cold discharge body is provided with a first through hole in communication with outside, and the water pump is provided with a second through hole in communication with outside. The first through hole is located on the end of the cold discharge body away from the connection with the water pump. The water tank and the cold discharge body are detachably connected. The modularized water-cooling heat sink has such a modular structure design that it is assembled as simple as an integrated water-cooling heat sink, and that the heat dissipation effect thereof is as good as a split water-cooling heat sink.

17 Claims, 14 Drawing Sheets

MODULARIZED WATER-COOLING HEAT SINK

FIELD OF THE INVENTION

The invention relates to heat sinks and, in particular, to a modularized water-cooled heat sink.

BACKGROUND OF THE INVENTION

In the do-it-yourself (DIY) realm of computer peripherals, water cooling has always been the preferred scheme for advanced enthusiasts to build computers. Compared with air cooling, water cooling has a better cooling effect for CPU overclocking. Nevertheless, the space required for water cooling is larger. The schemes of traditional water-cooling heat sinks are divided into integrated and split water cooling. The integrated water cooling scheme generally involves a cold head, a cold discharge, and a fan disposed on the cold discharge. Since the integrated water-cooling heat sinks can be installed in computers right out of the box, they are widely accepted by DIY users. However, its heat dissipation effect is not as good as split water cooling. The split water cooling scheme, on the other hand, has a larger heat capacity and a slower temperature rise, thus featuring a better cooling effect than the integrated water cooling. Unfortunately, it has a complicated installation procedure and costs more, hindering its popularity on the market. It is therefore desirable to have a water-cooling heat sink that can be installed as easily as the integrated water-cooling ones and have a heat dissipation effect as good as the split water-cooling ones.

In addition, the internal structure of the conventional cold discharge has equal left and right parts. The water flow rate is small, and the heat dissipation efficiency is low.

SUMMARY OF THE INVENTION

To overcome the shortcomings and deficiencies in the prior art, an objective of the invention is to provide a modularized water-cooling heat sink, which has a modularized structure for easy installation as integrated water-cooling ones and a heat dissipation effect as good as split water-cooling ones.

The disclosed modularized water-cooling heat sink includes a cold discharge body, a water tank and a water pump, wherein the water pump is in fluid communication with the water tank, and in fluid communication with the cold discharge body via an external cold head; the cold discharge body is provided with a first through hole in communication with outside, the water pump is provided with a second through hole in communication with outside; the first through hole is located at one end of the cold discharge body away from the connection with the water pump; and the water tank and the cold discharge body are connected in a detachable way.

The water pump is provided on one end of the water tank, and both the water tank and the water pump are disposed on the side of the cold discharge body near the first through hole.

The water pump is provided on one end of the water tank, and both the water tank and the water pump are disposed on the side of the cold discharge body away from the first through hole.

The water tank and the water pump are integrally formed.

The first through hole is connected with a first pipe, and the second through hole is connected with a second pipe.

The cross sections of the water pump and the water tank are both rectangular.

The areas of the cross sections of the water pump and the water tank are the same.

The thickness of the cold discharge body is not larger than the thickness of the water tank.

The cold discharge body includes a frame and a plurality of ducts therein. The first through hole is formed on one end of the frame. One end of the frame is in fluid communication with the other end thereof via the ducts.

Wherein, the modularized water-cooling heat sink further includes an automatic stop joint, and the automatic stop joint includes an automatic stop socket and an automatic stop plug detachably coupled to the automatic stop socket, and the water tank has the automatic stop plug, and the inside of the water tank communicates with the automatic stop plug and the outside of the water tank, and the cold discharge body has the automatic stop socket, and the inside of the cold discharge body communicates with the automatic stop socket and the outside of the cold discharge body.

Wherein, the stop plug of the water tank is coupled to the automatic stop socket of the cold discharge body.

Wherein, the automatic stop plug includes a plug sleeve, a plug reset part and a plug movable part, and an end of the plug movable part is sealed and inserted into the inside of the plug sleeve, and the outer periphery of the plug movable part has a plug water through hole, and the plug sleeve has a plug stop portion; the automatic stop socket includes a socket sleeve, a socket reset part and a socket movable part, and an end of the socket movable part is sealed and inserted into the inside of the socket sleeve, and the outer periphery of the socket movable part has a socket water through hole, and the socket sleeve has a socket stop portion; the plug sleeve is detachably coupled to the socket sleeve, and when the plug sleeve is coupled to the socket sleeve, the plug movable part presses the socket movable part, and the inside of the socket movable part is passed through the socket water through hole and communicated with the inside of the socket sleeve, and the inside of the plug movable part is passed through the plug water through hole and communicated with the inside of the plug sleeve, and the inside of the plug movable part is communicated with the inside of the socket movable part, and when the plug sleeve is not coupled to the socket sleeve, the plug reset part drives the plug movable part to move, so that the plug stop portion seals the plug water through hole, and the socket reset part drives the socket movable part to move, so that the socket stop portion seals the socket water through hole.

Wherein, the outer periphery of the end of the plug movable part has a plug waterproof gasket sheathed thereon, and when the plug sleeve is not coupled to the socket sleeve, the outer periphery of the plug waterproof gasket presses at the plug sleeve; the outer periphery of the end of the socket movable part has a socket waterproof gasket sheathed thereon, and when the socket sleeve is not coupled to the socket sleeve, the outer periphery of the socket waterproof gasket presses at the socket sleeve.

Wherein, the modularized water-cooling heat sink further includes an extension pipe, and the extension pipe has the automatic stop socket and the automatic stop plug, and both the automatic stop socket and the automatic stop plug communicate with the inside of the extension pipe and the outside of the extension pipe.

Wherein, the modularized water-cooling heat sink further includes an extension pump, and the extension pump has the automatic stop socket and the automatic stop plug, and both the automatic stop socket and the automatic stop plug communicate with the inside of the extension pump and the outside of the extension pump.

Wherein, the modularized water-cooling heat sink further includes an extension water discharger, and the extension water discharger has the automatic stop socket and the automatic stop plug, and both the automatic stop socket and the automatic stop plug communicate with the inside of the extension water discharger and the outside of the extension water discharger.

Wherein, the modularized water-cooling heat sink further includes an extension water storage tank, and the extension water storage tank has the automatic stop socket and the automatic stop plug, and both the automatic stop socket and the automatic stop plug communicate with the inside of the extension water storage tank and the outside of the extension water storage tank.

Wherein, the modularized water-cooling heat sink further includes an extension water cooling block, and the extension water cooling block has the automatic stop socket and the automatic stop plug, and both the automatic stop socket and the automatic stop plug communicate with the inside of the extension water cooling block and the outside of the extension water cooling block.

The invention has the following advantages:

Simple installation: The disclosed modularized water-cooling heat sink can be installed in a case together with the water tank and the cold discharge through the detachable connection of the water tank and the cold discharge, thereby greatly reducing the difficulty in installing the heat sink. According to the needs of the DIY user, the water tank and the cold discharge can be installed separately in the case.

Good heat dissipation effect: Since the internal structure of the traditional cold discharge has equal left and right parts, the water flow rate is small and the heat dissipation efficiency is low. The modularized water-cooling heat sink of the invention allows the coolant inside the cold discharge body to flow from one end to the other end thereof, owing to the fact that the first through hole and the connection between the water pump and the cold discharge are located on opposite ends of the cold discharge body. During the flowing process, the coolant can fully exchange heat with the cold discharge body, thereby improving the heat dissipation effect.

SUMMARY OF THE INVENTION

DESCRIPTION OF THE PREFERRED EMBODIMENTS

The aforementioned and other objectives and advantages of this disclosure will become clearer in light of the following detailed description of an illustrative embodiment of this invention described in connection with the drawings.

Figure 1:
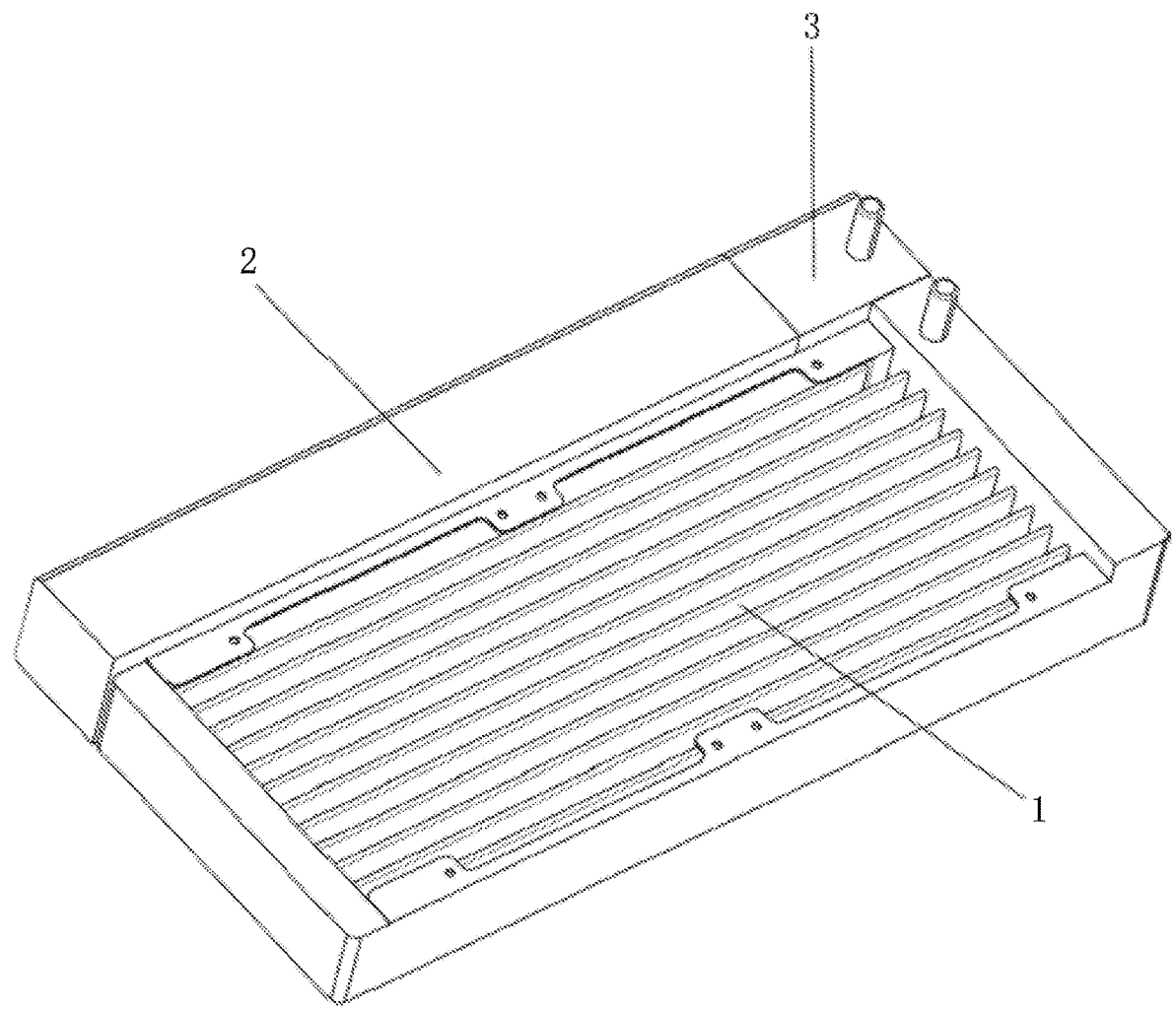
FIG. 1 is a schematic three-dimensional view of an embodiment of the invention.
Figure 2:
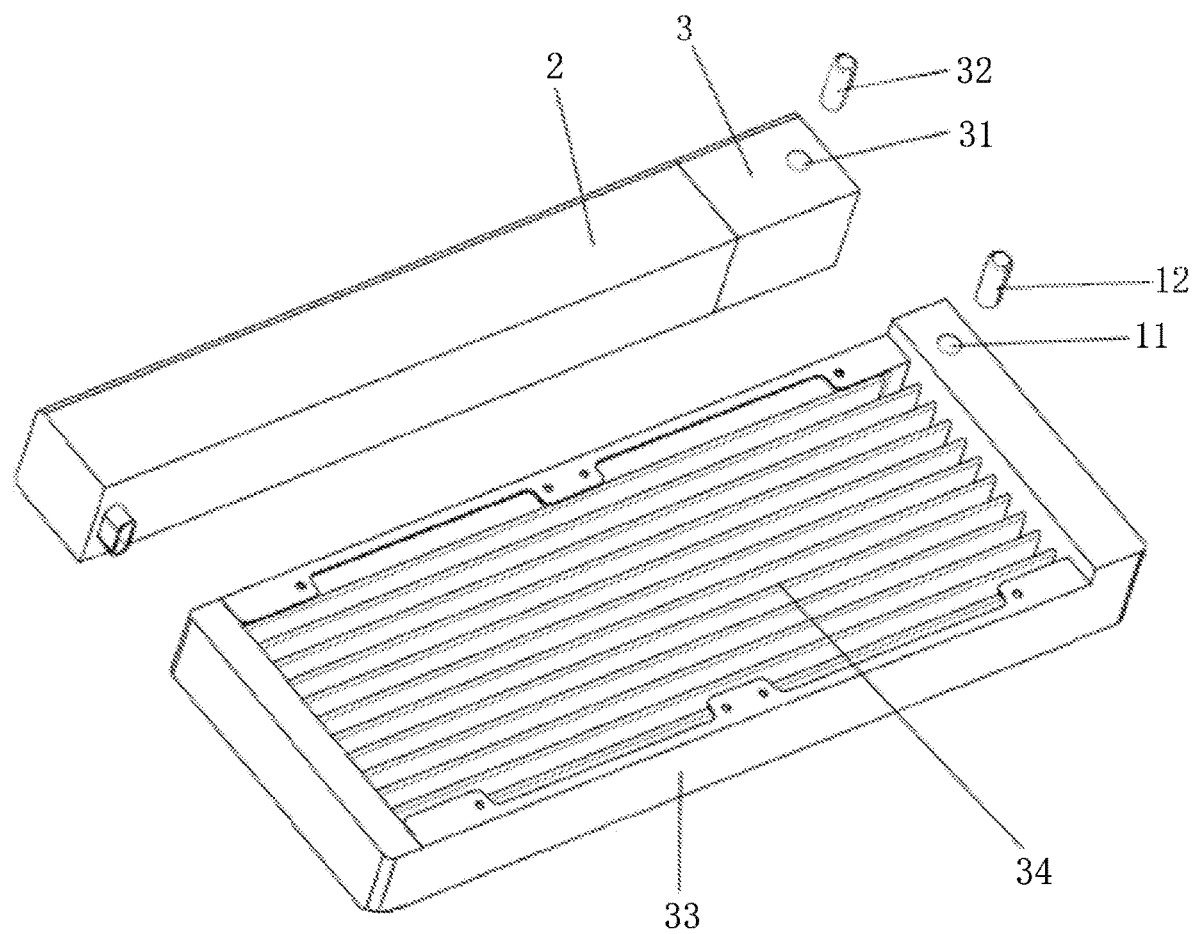
FIG. 2 is an exploded view an embodiment of the invention.

With reference to FIGS. 1 and 2, the disclosed modularized water-cooling heat sink includes a cold discharge body 1, a water tank 2, and a water pump 3. The water pump 3 is in fluid communication with the water tank 2, and is in fluid communication with the cold discharge body 1 via an external cold head. The cold discharge body 1 is provided with a first through hole 11 in communication with the outside. The water pump 3 is provided with a second through hole 31 in communication with the outside. The first through hole 11 is located at one end of the cold discharge body 1 away from the connection with the water pump 3. The water tank 2 and the cold discharge body 1 are connected in a detachable way.

More explicitly, the cold discharge body 1 includes a frame 33 and a plurality of ducts 34 therein. The first through hole 11 is formed on one end of the frame 33. One end of the frame 33 is in fluid communication with the other end thereof via the ducts 34.

The disclosed modularized water-cooling heat sink achieves the following advantages:

Simple installation: The disclosed modularized water-cooling heat sink can be installed in a case together with the water tank 2 and the cold discharge through the detachable connection of the water tank 2 and the cold discharge, thereby greatly reducing the difficulty in installing the heat sink. According to the needs of the DIY user, the water tank 2 and the cold discharge can be installed separately in the case.

Good heat dissipation effect: Since the internal structure of the traditional cold discharge has equal left and right parts, the water flow rate is small and the heat dissipation efficiency is low. The modularized water-cooling heat sink of the invention allows the coolant inside the cold discharge body to flow from one end to the other end thereof, owing to the fact that the first through hole 11 and the connection between the water pump 3 and the cold discharge body 1 are located on opposite ends of the cold discharge body 1. During the flowing process, the coolant can fully exchange heat with the cold discharge body 1 via the ducts 34, thereby improving the heat dissipation effect.

In the present embodiment, similar to the traditional split water-cooling heat sinks, the water tank 2 and the water pump 3 are integrally formed or two separate components that are integrated by assembly. Specifically, the water pump 3 is provided on one end of the water tank 2. According to needs, the DIY user can install both the water tank 2 and the water pump 3 on one side of the cold discharge body 1, or install both the water tank 2 and the water pump 3 on the other end of the cold discharge body 1, as long as the positions thereof do not affect the heat dissipation effect of the cold discharge body 1.

In an embodiment of the modularized water-cooling heat sink, the first through hole 11 is connected with a first pipe 12 and the second through hole 31 is connected with a second pipe 32, facilitating the connection and fluid communication between the cold discharge body 1 and the cold head via a soft pipe.

For a better appearance, the heat sink in the present embodiment has a rectangular cross section for both the water pump 3 and the water tank 2 with the areas thereof being the same. In addition to a rectangular cross section, the water pump 3 and the water tank 2 can also have different shapes from the present embodiment, and can adopt a design with different cross-sectional areas. The cross sections of the water pump 3 and the water tank 2 described in this embodiment are both optimized choices. It should be construed that other shapes and areas of the cross sections of the water pump 3 and the water tank 2 are still within the scope of this invention.

In this embodiment, the thickness of the cold discharge body 1 is not greater than the thickness of the water tank for the ease of installing the heat sink.

Figure 3:
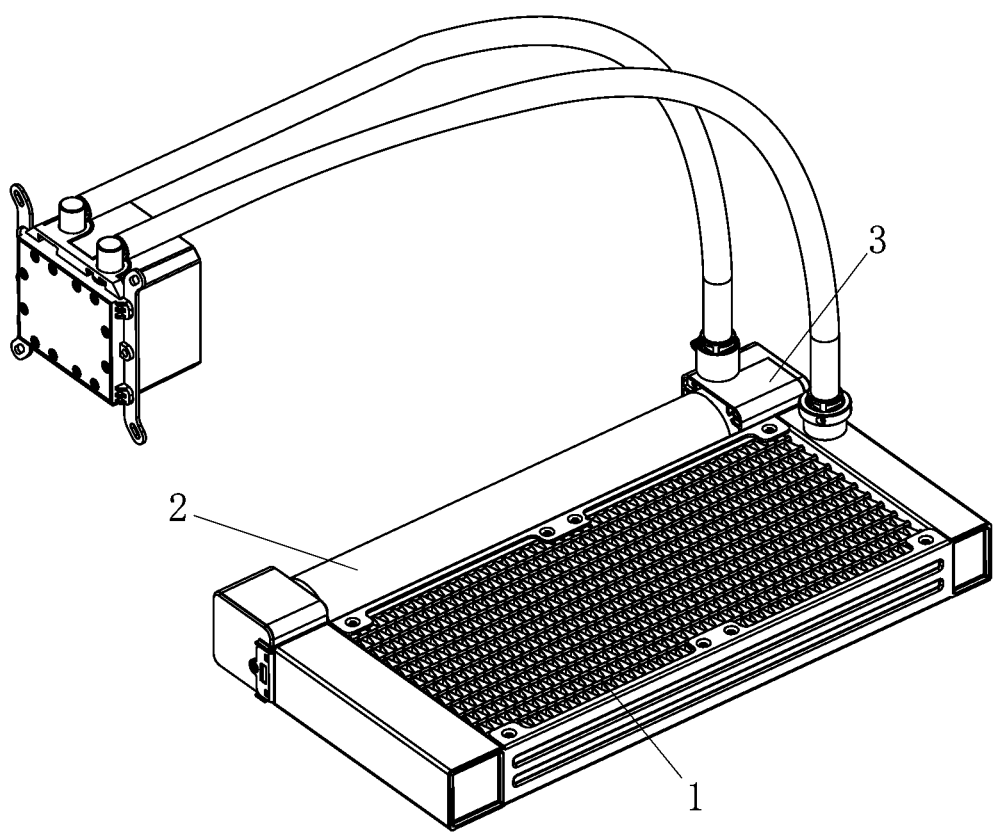
FIG. 3 is a perspective view of another embodiment of this invention.
Figure 4:
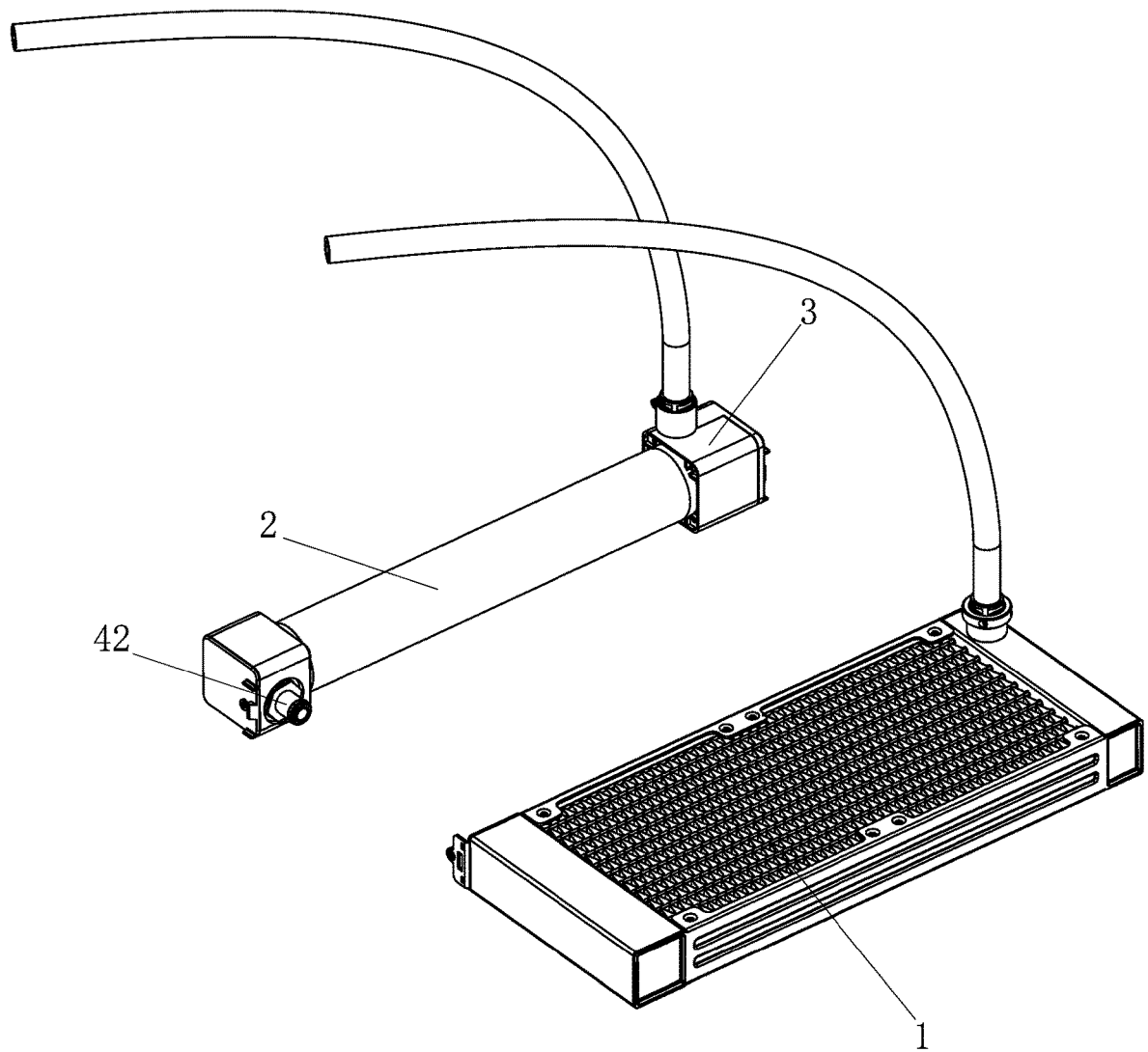
FIG. 4 is an exploded view of another embodiment of this invention viewing at a first angle.
Figure 5:
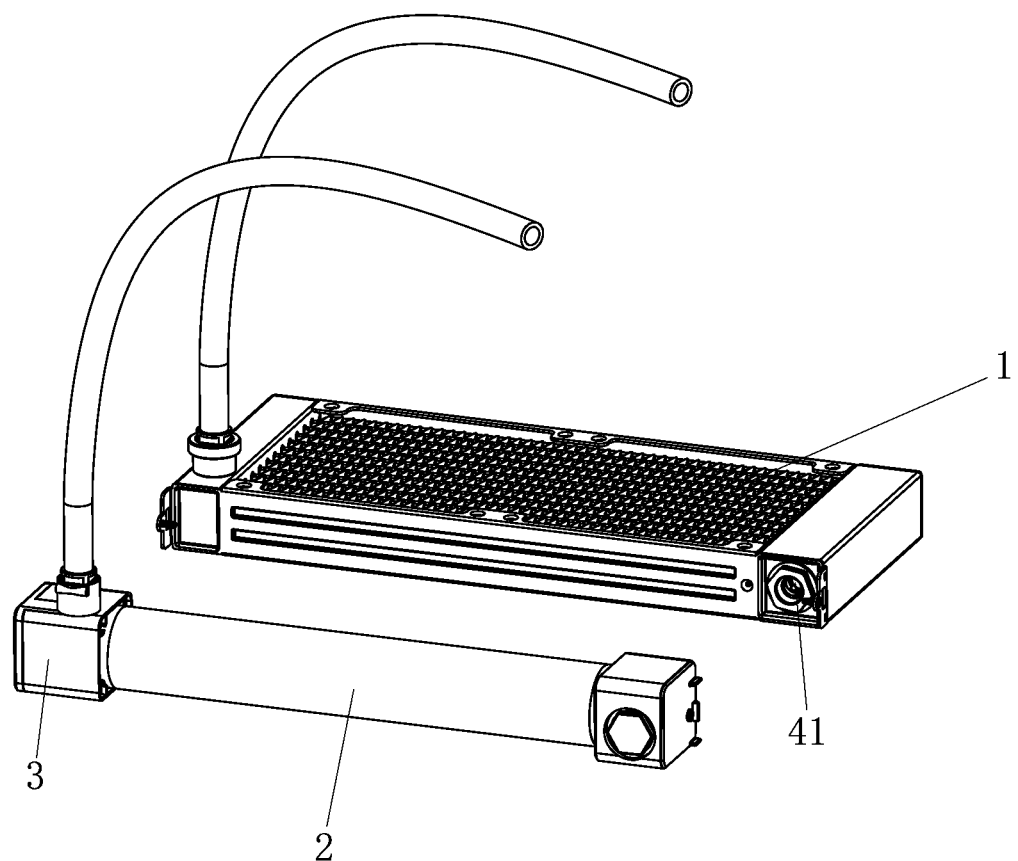
FIG. 5 is an exploded view of another embodiment of this invention viewing at a second angle.

In an embodiment as shown in FIGS. 3 to 5, the modularized water-cooling heat sink further includes an automatic stop joint 4, and the automatic stop joint 4 includes an automatic stop socket 41 and an automatic stop plug 42 detachably coupled to the automatic stop socket 41, and the water tank 2 has the automatic stop plug 42, and the inside of the water tank 2 communicating with the automatic stop plug 42 and the outside of the water tank 2, and the cold discharge body 1 has the automatic stop socket 41, and the inside of the cold discharge body 1 communicates with the automatic stop socket 41 and the outside of the cold discharge body 1. When the automatic stop socket 41 is not connected to the automatic stop plug 42, water can flow through the automatic stop joint 4, and when they are separated, the water flow will stop automatically, so that water cannot flow out from the automatic stop socket 41 or the automatic stop plug 42. The automatic stop joint 4 is installed on the cold discharge body 1 and the water tank 2, so that the cold discharge body 1 and the water tank 2, or the cold discharge body 1 and other parts can be connected or separated quickly.

In an embodiment as shown in FIGS. 4 and 5, the stop plug of the water tank 2 is connected to the automatic stop socket 41 of the cold discharge body 1.

Figure 6:
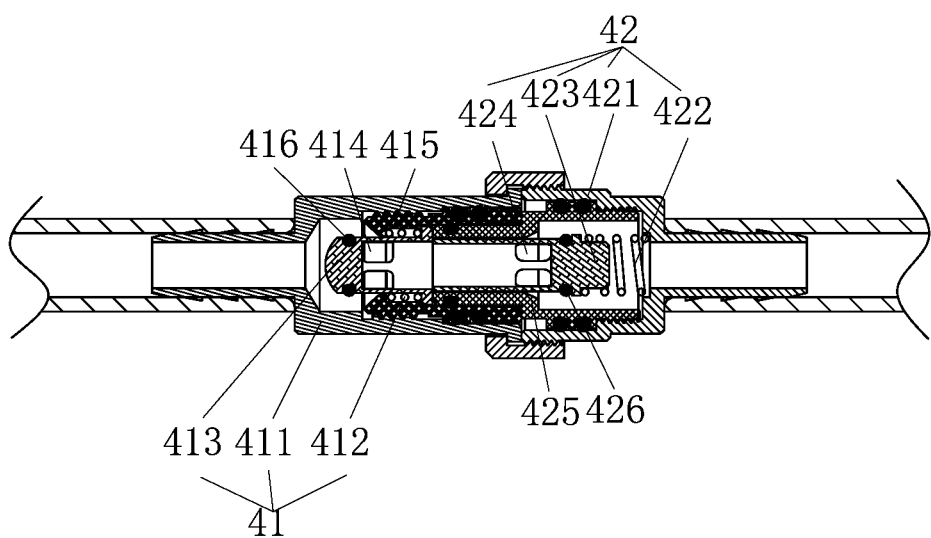
FIG. 6 is a cross-sectional view of an automatic stop socket and an automatic stop plug in a connected state in accordance with this invention.
Figure 7:
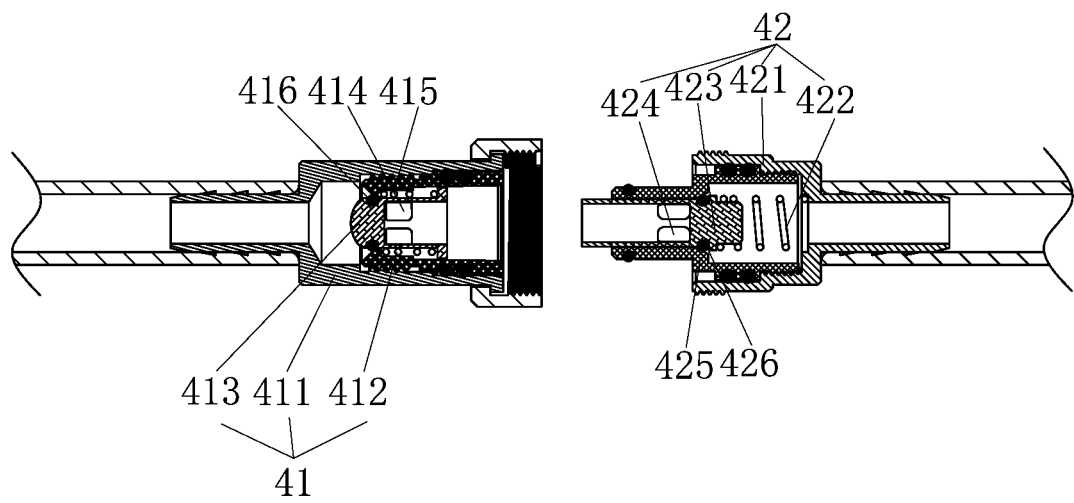
FIG. 7 is a cross-sectional view of an automatic stop socket and an automatic stop plug in a separated state in accordance with this invention.
Figure 8:
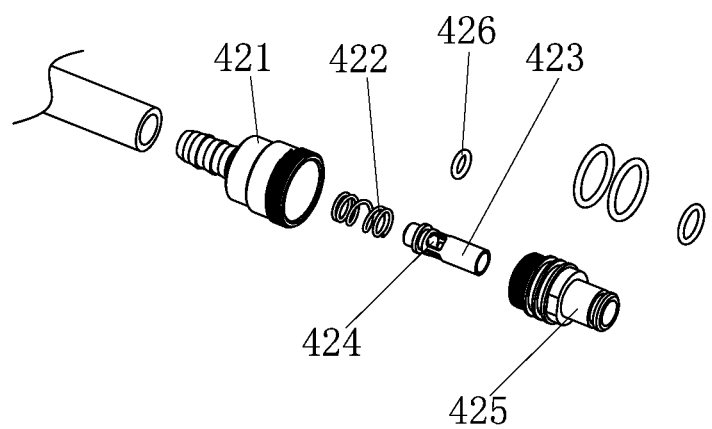
FIG. 8 is an exploded view of an automatic stop plug of this invention.
Figure 9:
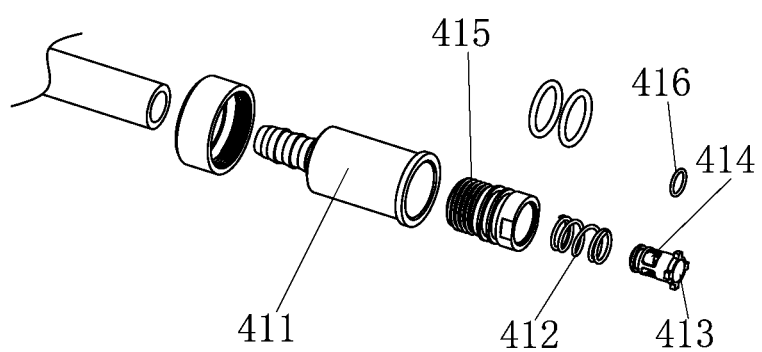
FIG. 9 is an exploded view of an automatic stop socket of this invention.

In an embodiment as shown in FIGS. 6 and 7, the automatic stop plug 42 includes a plug sleeve 421, a plug reset part 422 and a plug movable part 423, and an end of the plug movable part 423 is sealed and inserted into the inside of the plug sleeve 421, and the outer periphery of the plug movable part 423 has a plug water through hole 424, and the plug sleeve 421 has a plug stop portion 425; the automatic stop socket 41 includes a socket sleeve 411, a socket reset part 412 and a socket movable part 413, and an end of the socket movable part 413 is sealed and inserted into the inside of the socket sleeve 411, and the outer periphery of the socket movable part 413 has a socket water through hole 414, and the socket sleeve 411 has a socket stop portion 415. The socket reset part 412 has an end connected to the socket movable part 413 and the other end connected to the socket sleeve 411; and the plug reset part 422 has an end connected to the plug movable part 423 and the other end connected to the plug sleeve 421. The plug sleeve 421 is detachably connected to the socket sleeve 411, wherein the plug sleeve 421 and the socket sleeve 411 can be detachably connected to each other by a screw connection.

When the plug sleeve 421 is connected to the socket sleeve 411, the plug movable part 423 presses at the socket movable part 413, so that both of the public movable part and the socket movable part 413 are moved. Now, the socket stop portion 415 does not block the socket water through hole 414, and the inside of the socket movable part 413 is passed through the socket water through hole 414 and communicated with the inside of the socket sleeve 411, and the plug stop portion 425 does not block the plug water through hole 424, and the inside of the plug movable part 423 is passed through the plug water through hole 424 and communicated with the inside of the plug sleeve 421, and the inside of the plug movable part 423 is communicated with the inside of the socket movable part 413, so that water can flow from the inside of the plug sleeve 421 into the inside of the socket sleeve 411. The inside of a part having the automatic stop plug 42 is communicated with the outside of the plug sleeve 421, and the inside of the part having the automatic stop socket 41 is communicated with the inside of the socket sleeve 411, so that water can flow between the part having the automatic stop plug 42 and the part having the automatic stop socket 41.

When the plug sleeve 421 is not connected to the socket sleeve 411 (or the automatic stop plug 42 and the automatic stop socket 41 are situated at a separated state, the plug reset part 422 drives the plug movable part 423 to move, so that the plug stop portion 425 seals the plug water through hole 424, and the socket reset part 412 drives the socket movable part 413 to move, so that the socket stop portion 415 seals the socket water through hole 414, and the water in the plug sleeve 421 cannot pass through or flow out from the plug water through hole 424, and the water in the socket sleeve 411 cannot pass through or flow out from the socket water through hole 414, so as to achieve the effect of stopping water automatically.

In an embodiment as shown in FIGS. 6 to 9, the outer periphery of an end of the plug movable part 423 is sheathed with a plug waterproof gasket 426, such that when the plug sleeve 421 is not connected to the socket sleeve 411, the outer periphery of the plug waterproof gasket 426 presses at the plug sleeve 421; the outer periphery of the end of the socket movable part 413 is sheathed with a socket waterproof gasket 416, such that when the socket sleeve 411 is not connected to the socket sleeve 411, the outer periphery of the socket waterproof gasket 416 presses at the socket sleeve 411, so as to further improve the performance of stopping water and prevent water from flowing out from the automatic stop plug 42 or the automatic stop socket 41 automatically when the automatic stop plug 42 is not connected to the automatic stop socket 41.

Figure 10:
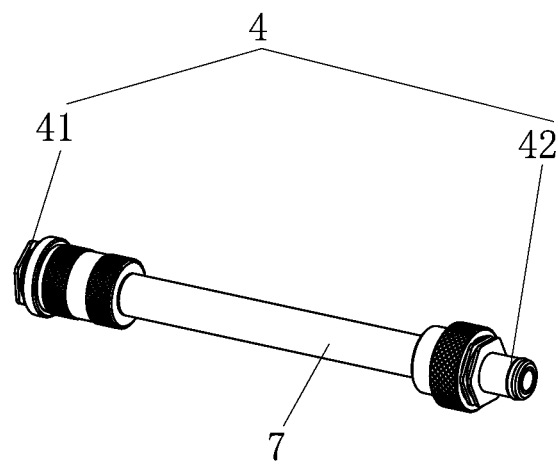
FIG. 10 is a perspective view of an extension pipe of this invention.

In an embodiment as shown in FIG. 10, the modularized water-cooling heat sink further includes an extension pipe 7, and the extension pipe 7 has the automatic stop socket 41 and the automatic stop plug 42, and both of the automatic stop socket 41 and the automatic stop plug 42 are communicated with the inside of the extension pipe 7 and the outside of the extension pipe 7. The extension pipe 7 is provided for extending the distance. If the automatic stop plug 42 of the water tank 2 is connected to the automatic stop socket 41 of the extension pump 4 and the automatic stop socket 41 of the cold discharge body 1 is connected to the automatic stop plug 42 of the extension pump 4, the distance between the water tank 2 and the cold discharge body 1 will be extended to fit different installation scenarios.

Figure 12:
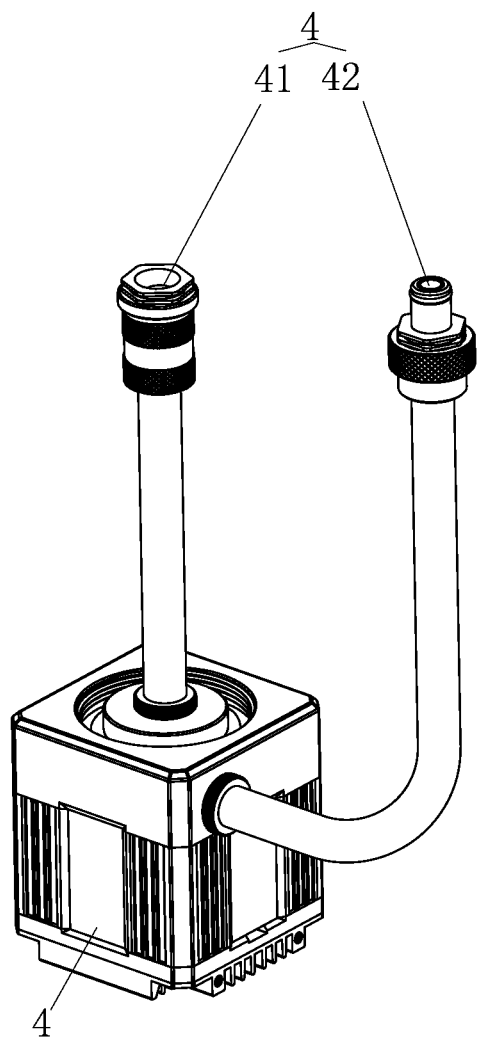
FIG. 12 is a perspective view of an extension pump of this invention.

In an embodiment as shown in FIG. 12, the modularized water-cooling heat sink further includes an extension pump 4, and the extension pump 4 has the automatic stop socket 41 and the automatic stop plug 42, and both the automatic stop socket 41 and the automatic stop plug 42 communicate with the inside of the extension pump 4 and the outside of the extension pump 4. The extension pump 4 can improve the pumping capability of the modularized water-cooling heat sink. If the automatic stop plug 42 of the water tank 2 is connected to the automatic stop socket 41 of the extension pump 4 and the automatic stop socket 41 and the automatic stop plug 42 of the cold discharge body 1 are connected, the water flow rate between the cold discharge body 1 and the water tank 2 will be accelerated.

Figure 13:
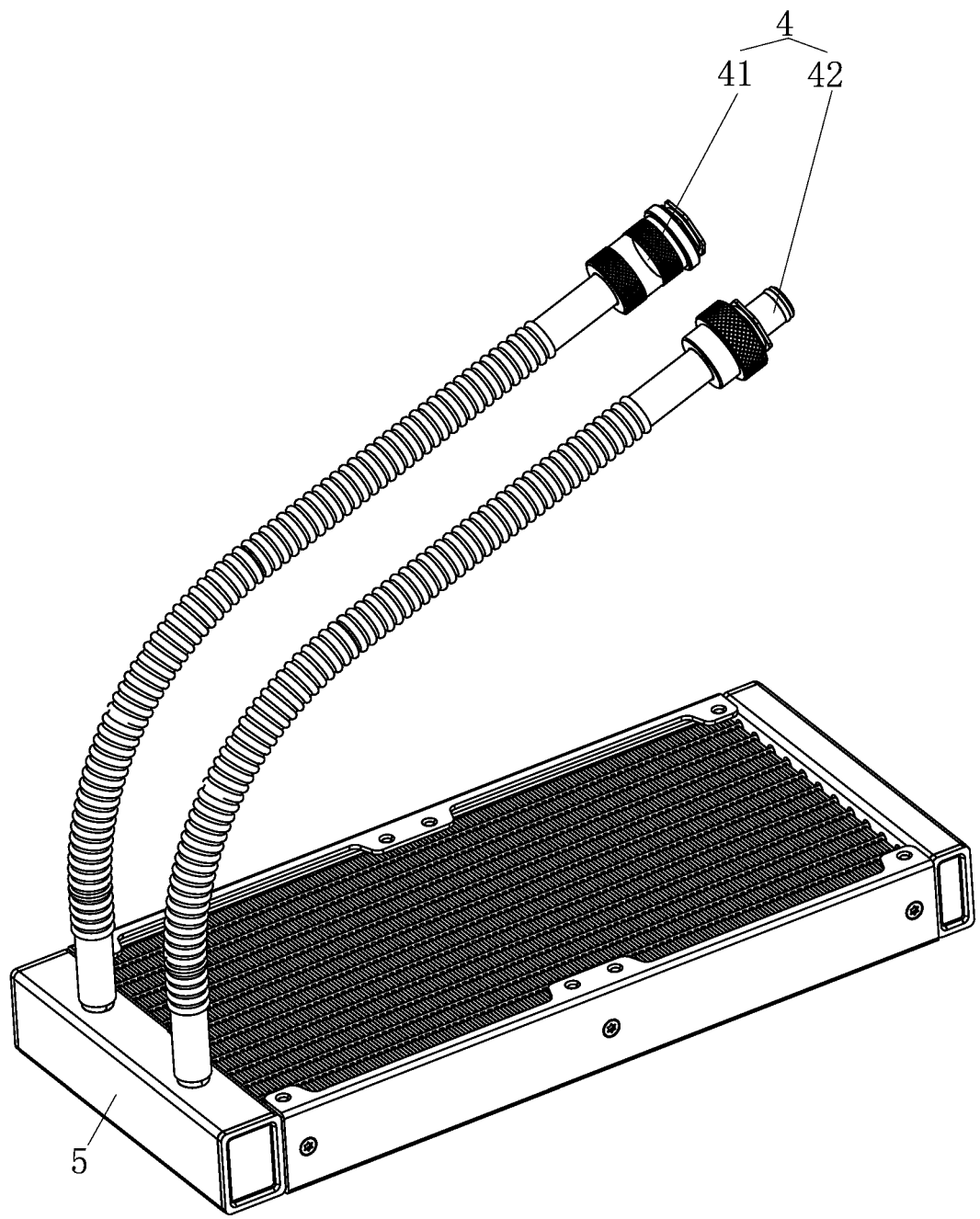
FIG. 13 is a perspective view of an extension water discharger of this invention.

In an embodiment as shown in FIG. 13, the modularized water-cooling heat sink further includes an extension water discharger 5, and the extension water discharger 5 has the automatic stop socket 41 and the automatic stop plug 42, and both the automatic stop socket 41 and the automatic stop plug 42 communicate with the inside of the extension water discharger 5 and the outside of the extension water discharger 5. If the automatic stop plug 42 of the water tank 2 is connected to the automatic stop socket 41 of the extension water discharger 5 and the automatic stop socket 41 of the cold discharge body 1 is connected to the automatic stop plug 42 of the extension water discharger 5, the volume of displaced water and the cooling area of the entire cooling system will be increased to enhance the cooling capability.

Figure 14:
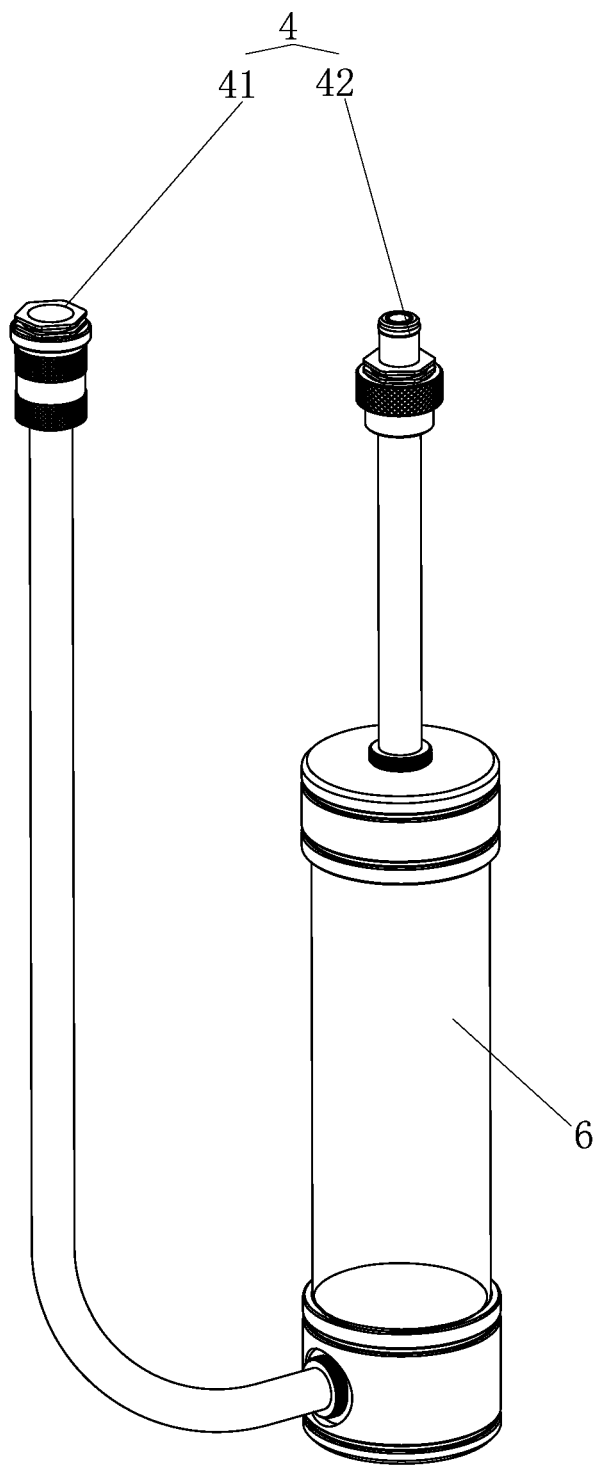
FIG. 14 is a perspective view of an extension water storage tank of this invention.

In an embodiment as shown in FIG. 14, the modularized water-cooling heat sink further includes an extension water storage tank 6, and the extension water storage tank 6 has the automatic stop socket 41 and the automatic stop plug 42, and both the automatic stop socket 41 and the automatic stop plug 42 communicate with the inside of the extension water storage tank 6 and the outside of the extension water storage tank 6. If the automatic stop plug 42 of the water tank 2 is connected to the automatic stop socket 41 of the extension water storage tank 6 and the automatic stop socket 41 of the cold discharge body 1 is connected to the automatic stop plug 42 of the extension water storage tank 6, the water storage capacity of the modularized water-cooling heat sink will be increased.

Figure 11:
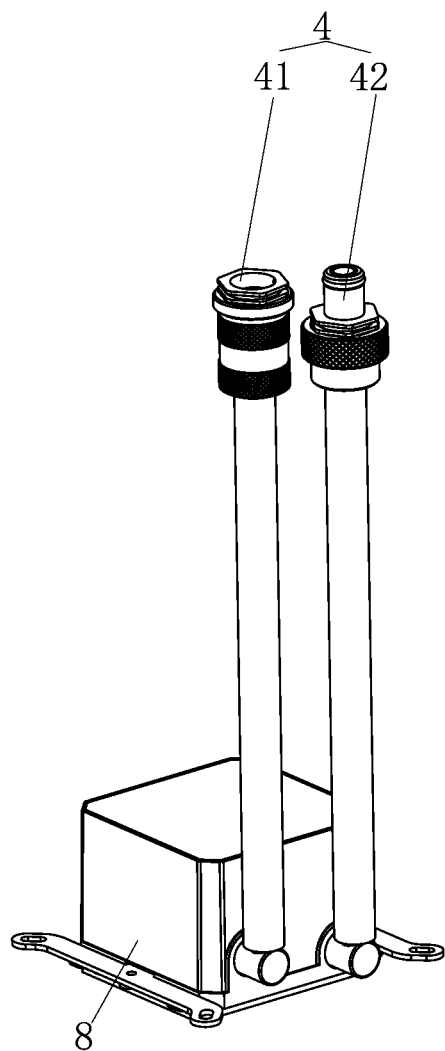
FIG. 11 is a perspective view of an extension water cooling block of this invention.

In an embodiment as shown in FIG. 11, the modularized water-cooling heat sink further includes an extension water cooling block 8, and the extension water cooling block 8 has the automatic stop socket 41 and the automatic stop plug 42, and both the automatic stop socket 41 and the automatic stop plug 42 communicate with the inside of the extension water cooling block 8 and the outside of the extension water cooling block 8, so as to facilitate users to add the water cooling blocks.

While the invention is described in some detail hereinbelow with reference to certain illustrated embodiments, it is to be understood that there is no intent to limit it to those embodiments. On the contrary, the aim is to cover all modifications, alternatives and equivalents falling within the spirit and scope of the invention as defined by the appended claims.

What is claimed is:

1. A modularized water-cooling heat sink, comprising:
    a cold discharge body 1,
    a water tank (2),
    a water pump (3), and
    an automatic stop joint (4) comprising an automatic stop socket (41) and an automatic stop plug (42),
    wherein the water tank (2) having the automatic stop plug (42), a first end of the water tank (2) is in fluid communication with the water pump (3) and a second end thereof is in fluid communication with the cold discharge body (1);
    the water pump (3) is in fluid communication with the cold discharge body (1) via an external cold head;
    the cold discharge body (1) having the automatic stop socket (41), the cold discharge body (1) is provided with a first through hole (11) in fluid communication with an external water source and the water pump is provided with a second through hole (31) in fluid communication with the outside external water source;
    the first through hole (11) is located on one side of a first end of the cold discharge body (1); and the water tank (2) and the cold discharge body (1) are detachably connected;
    an inside of the water tank (2) communicating with the automatic stop plug (42) and an outside of the water tank (2); and
    an inside of the cold discharge body (1) communicating with the automatic stop socket (41) and an outside of the cold discharge body (1).

2. The modularized water-cooling heat sink of claim 1, wherein the water pump (3) is disposed on the first end of the water tank (2), and the water tank (2) and the water pump (3) are both disposed on a side of the cold discharge body (1) which is adjacent to the side of the first end of the cold discharge body (1) which has the first through hole (11).

3. The modularized water-cooling heat sink of claim 1, wherein the water pump (3) is disposed on the first end of the water tank (2), and the water tank (2) and the water pump (3) are both disposed on a side of the cold discharge body 1 which is not adjacent to the side of the first end of the cold discharge body (1) which has from the first through hole (11).

4. The modularized water-cooling heat sink of claim 1, wherein the water tank (2) and the water pump (3) are integrally formed.

5. The modularized water-cooling heat sink of claim 1, wherein the first through hole (11) is connected with a first pipe (12) and the second through hole (31) is connected with a second pipe (32).

6. The modularized water-cooling heat sink of claim 1, wherein the cross section of the water pump (3) and the cross section of the water tank (2) are both rectangular.

7. The modularized water-cooling heat sink of claim 1, wherein the areas of the cross sections of the water pump (3) and the water tank (2) are the same.

8. The modularized water-cooling heat sink of claim 1, wherein the thickness of the cold discharge body (1) is not greater than the thickness of the water tank (2).

9. The modularized water-cooling heat sink of claim 1 with the cold discharge body (1) including a frame (33) and a plurality of ducts (34) therein, wherein the first through hole (11) is formed on one end of the frame (33), and the one end of the frame (33) is in fluid communication with an opposite end thereof via the plurality of ducts (34).

10. The modularized water-cooling heat sink of claim 1, wherein the automatic stop plug (42) of the water tank (2) is coupled to the automatic stop socket (41) of the cold discharge body (1).

11. The modularized water-cooling heat sink of claim 1, wherein the automatic stop plug (42) further comprises a plug sleeve (421), a plug reset part (422) and a plug movable part (423), and an end of the plug movable part (423) is sealed and inserted into the inside of the plug sleeve (421), and an outer periphery of the plug movable part (423) has a plug water through hole (424), and the plug sleeve (421) has a plug stop portion (425);

the automatic stop socket (41) comprises a socket sleeve (411), a socket reset part (412) and a socket movable part (413), and an end of the socket movable part (413) is sealed and inserted into the inside of the socket sleeve (411), and an outer periphery of the socket movable part (413) has a socket water through hole (414), and the socket sleeve (411) has a socket stop portion (415);

the plug sleeve (421) is detachably coupled to the socket sleeve (411), and when the plug sleeve (421) is coupled to the socket sleeve (411), the plug movable part (423) presses the socket movable part (413), and an inside of the socket movable part (413) is passed through the socket water through hole (414) and communicated with an inside of the socket sleeve (411), and an inside of the plug movable part (423) is passed through the plug water through hole (424) and communicated with an inside of the plug sleeve (421), and the inside of the plug movable part (423) is communicated with the inside of the socket movable part (413), and when the plug sleeve (421) is not coupled to the socket sleeve (411), the plug reset part (422) drives the plug movable part (423) to move, so that the plug stop portion (425) seals the plug water through hole (424), and the socket reset part (412) drives the socket movable part (413) to move, so that the socket stop portion (415) seals the socket water through hole (414).

12. The modularized water-cooling heat sink of claim 11, wherein the outer periphery of the end of the plug movable part (423) has a plug waterproof gasket (426) sheathed thereon, and when the plug sleeve (421) is not coupled to the socket sleeve (411), the outer periphery of the plug waterproof gasket (426) presses at the plug sleeve (421); the outer periphery of the end of the socket movable part (413) has a socket waterproof gasket (416) sheathed thereon, and when the socket sleeve (411) is not coupled to the socket sleeve (411), the outer periphery of the socket waterproof gasket (416) presses at the socket sleeve (411).

13. The modularized water-cooling heat sink of claim 1, further comprising an extension pipe (7), and the extension pipe (7) having the automatic stop socket (41) and the automatic stop plug (42), and both the automatic stop socket (41) and the automatic stop plug (42) communicating with an inside of the extension pipe (7) and an outside of the extension pipe (7).

14. The modularized water-cooling heat sink of claim 1, further comprising an extension pump (4), and the extension pump (4) having the automatic stop socket (41) and the automatic stop plug (42), and both the automatic stop socket (41) and the automatic stop plug (42) communicating with an inside of the extension pump (4) and an outside of the extension pump (4).

15. The modularized water-cooling heat sink of claim 1, further comprising an extension water discharger (5), and the extension water discharger (5) having the automatic stop socket (41) and the automatic stop plug (42), and both the automatic stop socket (41) and the automatic stop plug (42) communicating with an inside of the extension water discharger (5) and an outside of the extension water discharger (5).

16. The modularized water-cooling heat sink of claim 1, further comprising an extension water storage tank (6), and the extension water storage tank (6) having the automatic stop socket (41) and the automatic stop plug (42), and both the automatic stop socket (41) and the automatic stop plug (42) communicating with an inside of the extension water storage tank (6) and an outside of the extension water storage tank (6).

17. The modularized water-cooling heat sink of claim 1, further comprising an extension water cooling block (8), and the extension water cooling block (8) having the automatic stop socket (41) and the automatic stop plug (42), and both the automatic stop socket (41) and the automatic stop plug (42) communicating with an inside of the extension water cooling block (8) and an outside of the extension water cooling block (8).

\* \* \* \* \*